(12) United States Patent
Arimitsu et al.

(10) Patent No.: US 10,720,259 B2
(45) Date of Patent: Jul. 21, 2020

(54) ELECTROCONDUCTIVE FILM AND METHOD FOR MANUFACTURING ELECTROCONDUCTIVE PATTERN

(71) Applicants: TOKYO UNIVERSITY OF SCIENCE FOUNDATION, Tokyo (JP); NISSAN CHEMICAL INDUSTRIES, LTD., Tokyo (JP)

(72) Inventors: Koji Arimitsu, Tokyo (JP); Makoto Wakabayashi, Tokyo (JP)

(73) Assignees: TOKYO UNIVERSITY OF SCIENCE FOUNDATION, Tokyo (JP); NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/507,971

(22) PCT Filed: Sep. 1, 2015

(86) PCT No.: PCT/JP2015/074832
§ 371 (c)(1),
(2) Date: Mar. 1, 2017

(87) PCT Pub. No.: WO2016/035785
PCT Pub. Date: Mar. 10, 2016

(65) Prior Publication Data
US 2017/0309363 A1 Oct. 26, 2017

(30) Foreign Application Priority Data
Sep. 2, 2014 (JP) .................................. 2014-178018

(51) Int. Cl.
*G03F 7/004* (2006.01)
*G03F 7/16* (2006.01)
(Continued)

(52) U.S. Cl.
CPC ............. *H01B 1/127* (2013.01); *C03C 17/28* (2013.01); *G03F 7/162* (2013.01); *G03F 7/168* (2013.01);
(Continued)

(58) Field of Classification Search
CPC ..... H01L 51/0023; C03C 17/28; H01B 1/127; H01B 13/0036; H01B 13/003; H01B 5/14;
(Continued)

(56) References Cited

U.S. PATENT DOCUMENTS 3,522,049 A * 7/1970 van den Bogaert ......................... C08G 18/606
430/191
3,695,912 A * 10/1972 DeLaurentis ...... B41M 5/38235
156/234
(Continued)

FOREIGN PATENT DOCUMENTS

JP 2001-47747 A 2/2001
JP 2012-251132 A 12/2012
(Continued)

OTHER PUBLICATIONS

Hansen et al., "Direct fast patterning of conductive polymers using agarose stamping", Adv. Mater., vol. 19 pp. 3261-3265 (2007).*
(Continued)

*Primary Examiner* — Martin J Angebrannndt
(74) *Attorney, Agent, or Firm* — Birch, Stewart, Kolasch & Birch, LLP

(57) ABSTRACT

A method for manufacturing an electroconductive pattern 40, provided with: a lamination step for laminating an acid generation film 10 containing an acid proliferation agent and a photoacid generator on a polymer film 20 containing an electroconductive polymer formed on a substrate 21; a
(Continued)

masking step for masking the top of the acid generation film 10; a light irradiation step for irradiating the laminate from the acid-generation-film 10 side; a doping step for doping the electroconductive polymer with an acid generated and proliferated in the acid generation film 10 by the light irradiation; and a releasing step for releasing the acid generation film 10 from the polymer film 20. This method makes it possible to provide an electroconductive film and a method for manufacturing an electroconductive pattern in which photoacid generation and acid proliferation effects are utilized.

5 Claims, 2 Drawing Sheets

(51) Int. Cl.
  *G03F 7/20* (2006.01)
  *G03F 7/34* (2006.01)
  *G03F 7/09* (2006.01)
  *H01B 5/14* (2006.01)
  *H01B 1/12* (2006.01)
  *H01B 13/00* (2006.01)
  *H01L 51/00* (2006.01)
  *C03C 17/28* (2006.01)

(52) U.S. Cl.
  CPC ............ *G03F 7/2004* (2013.01); *G03F 7/343* (2013.01); *H01B 5/14* (2013.01); *H01B 13/003* (2013.01); *H01B 13/0036* (2013.01); *H01L 51/0023* (2013.01); *G03F 7/0045* (2013.01); *G03F 7/093* (2013.01)

(58) Field of Classification Search
  CPC ........ G03F 7/004; G03F 7/2004; G03F 7/168; G03F 7/162; G03F 7/343; G03F 7/0045; G03F 7/093; G03F 7/28
  See application file for complete search history.

(56) References Cited

U.S. PATENT DOCUMENTS

| | | | | |
|---|---|---|---|---|
| 5,198,153 | A * | 3/1993 | Angelopoulos | C08G 61/12 252/500 |
| 5,403,695 | A * | 4/1995 | Hayase | G03F 7/0233 430/165 |
| 5,641,715 | A * | 6/1997 | Okamoto | G03F 7/0045 148/DIG. 137 |
| 5,804,354 | A * | 9/1998 | Watanabe | C08G 73/0266 430/273.1 |
| 6,323,287 | B1 * | 11/2001 | Foster | B41C 1/1008 525/328.8 |
| 8,932,494 | B2 * | 1/2015 | Liao | H01B 1/128 252/501.1 |
| 2001/0009749 | A1 * | 7/2001 | Yamana | G03F 7/039 430/270.1 |
| 2003/0087179 | A1 * | 5/2003 | Iwasaki | G03F 7/0233 430/166 |
| 2003/0134222 | A1 * | 7/2003 | Lee | G03F 7/0233 430/191 |
| 2003/0194619 | A1 * | 10/2003 | Sasaki | G03F 1/78 430/5 |
| 2004/0126696 | A1 * | 7/2004 | Inomata | G03F 7/0047 430/270.1 |
| 2004/0166435 | A1 * | 8/2004 | Lee | C08G 61/123 430/270.1 |
| 2005/0009227 | A1 * | 1/2005 | Xiao | B82Y 10/00 438/82 |
| 2006/0244368 | A1 * | 11/2006 | Nagayama | H01L 51/0021 313/504 |
| 2007/0176167 | A1 * | 8/2007 | Parthasarathy | H01L 51/56 257/40 |
| 2008/0299486 | A1 * | 12/2008 | Mahoney | G03F 7/0041 430/270.1 |
| 2009/0155571 | A1 * | 6/2009 | Mustonen | B41M 5/165 428/327 |
| 2010/0009296 | A1 * | 1/2010 | Kon | C09D 5/24 430/321 |
| 2010/0061212 | A1 * | 3/2010 | Kamo | G03H 1/18 369/103 |
| 2011/0209906 | A1 * | 9/2011 | Ihara | G03F 7/093 174/257 |
| 2011/0266532 | A1 * | 11/2011 | Liao | H01B 1/128 257/40 |
| 2014/0020939 | A1 | 1/2014 | Nishio et al. | |
| 2014/0349222 | A1 * | 11/2014 | Shibui | G03F 7/038 430/18 |
| 2015/0160554 | A1 * | 6/2015 | Liu | G03F 7/039 430/18 |
| 2016/0075875 | A1 * | 3/2016 | Hatakeyama | C08L 25/18 252/500 |
| 2016/0078977 | A1 * | 3/2016 | Hatakeyama | H01B 1/127 252/500 |

FOREIGN PATENT DOCUMENTS

| | | | | |
|---|---|---|---|---|
| JP | 2013-247250 A | | 12/2013 | |
| JP | 2014-179234 | * | 9/2014 | ............ H01B 13/00 |
| JP | 2014-189597 | * | 10/2014 | ............ C08L 83/07 |

OTHER PUBLICATIONS

International Search Report for PCT/JP2015/074832 (PCT/ISA/210) dated Dec. 8, 2015.
Written Opinion of the International Searching Authority for PCT/JP2015/074832 (PCT/ISA/237) dated Dec. 8, 2015.

* cited by examiner

ELECTROCONDUCTIVE FILM AND METHOD FOR MANUFACTURING ELECTROCONDUCTIVE PATTERN

TECHNICAL FIELD

This invention relates to a method of producing an electroconductive film and an electroconductive pattern. More specifically, the invention relates to an electroconductive film and electroconductive pattern production method which makes use of the doping of an electrically conductive polymer with acid generated by a photoacid generating reaction.

BACKGROUND ART

Transparent electroconductive films formed using electrically conductive polymers are being studied for practical application to, e.g., electrolytic capacitors, antistatic agents, batteries, and organic electroluminescent (EL) devices.

In order for a conductive polymer to be utilized as a transparent electroconductive film, it must be patterned into a shape that accords with the intended purpose.

Hitherto known methods of patterning conductive polymers include photoetching (see Patent Document 1) and screen printing. However, both have drawbacks in that they are complicated processes and the linewidths obtained are large.

Another problem is that when a wet process with an etching solution is used during patterning, as in the technique in Patent Document 1, this has an adverse effect on the electroconductive layer.

PRIOR ART DOCUMENTS

Patent Documents

Patent Document 1: JP-A 2013-247250

SUMMARY OF THE INVENTION

Problems to be Solved by the Invention

In light of the above circumstances, the object of the invention is to provide an electroconductive film and electroconductive pattern production method which makes use of photoacid generating and acid proliferating effects.

Means for Solving the Problems

The inventors have conducted extensive investigations in order to achieve these objects. As a result, they have discovered that, by using a photoacid generator and an acid proliferating agent which autocatalytically generates acid and irradiating these with light, the generated and proliferated acid can be used as a dopant in an electrically conductive polymer dopant. In addition, they have found that, by laminating together an electrically conductive polymer film and an acid generating film that contains an acid proliferating agent and an acid generator and exposing the laminated films to light, it is possible to produce an electroconductive film that utilizes a dry doping effect due to such photoacid generation, and also that, by masking the films during light exposure, it is possible to produce an electroconductive pattern by dry photopatterning.

Accordingly, the invention provides:
1. A method of producing an electroconductive film, which method is characterized by comprising the steps of: laminating an acid generating film that contains an acid proliferating agent and an acid generator onto an electrically conductive polymer-containing polymer film formed on a substrate so as to obtain a laminate; irradiating light onto the laminate from the acid generating film side thereof; doping the electrically conductive polymer with acid that is generated and proliferates within the acid generating film on account of the light irradiation; and releasing the acid generating film from the polymer film;
2. The electroconductive film production method of 1 above which further comprises, after the lamination step and before the light irradiation step, the step of masking the acid generating film;
3. The electroconductive film production method of 1 or 2 above, wherein the acid generating film is formed beforehand on a support;
4. The electroconductive film production method of any one of 1 to 3 above, wherein the acid generating film also includes a release agent;
5. A method of producing an electroconductive film, which method is characterized by comprising the steps of: applying a composition that contains an electrically conductive polymer, an acid proliferating agent and a photoacid generator onto a substrate, and drying the applied composition so as to obtain a polymer film; irradiating the polymer film with light; and doping the electrically conductive polymer with acid that is generated and proliferates within the polymer film on account of the light irradiation;
6. An electroconductive film or an electroconductive patterning composition which includes an electrically conductive polymer, an acid proliferating agent and a photoacid generator;
7. An acid generating layer-forming composition for forming an acid generating layer that is laminated onto an electrically conductive polymer-containing polymer layer and wherein acid that is generated and proliferates on account of light irradiation migrates onto the polymer layer and acts as a dopant for the electrically conductive polymer, which acid generating layer-forming composition is characterized by comprising an acid proliferating agent and a photoacid generator;
8. The acid generating layer-forming composition of 7 above which further comprises a release agent;
9. A kit for producing an electroconductive film or an electroconductive pattern, which kit is characterized by separately comprising: a polymer film-forming composition which includes an electrically conductive polymer, and an acid generating layer-forming composition which includes an acid proliferating agent and a photoacid generator;
10. The electroconductive film or electroconductive pattern producing kit of 9 above, wherein the acid generating layer-forming composition further includes a release agent;
11. The electroconductive film or electroconductive pattern producing kit of 9 or 10 above, wherein the electrically conductive polymer includes poly(3,4-ethylenedioxythiophene), the acid proliferating agent is a compound that generates an alkyl or aryl sulfonic acid via acid catalysis, and the photoacid generator is an aryl sulfonic acid ester of naphthaleneimide; and
12. A method of doping an electrically conductive polymer, the method being characterized by doping an electrically conductive polymer with acid that is generated and proliferates when an acid proliferating agent and a photoacid generator are irradiated with light.

Advantageous Effects of the Invention

This invention, by using a photoacid generator and an acid proliferating agent that autocatalytically generates acid, and using the acid that is generated and proliferates by subjecting these to light irradiation as a dopant for an electrically conductive polymer, enables the production of an electroconductive film by dry doping and the production of an electroconductive pattern by dry photopatterning.

BRIEF DESCRIPTION OF THE DIAGRAMS

EMBODIMENT FOR CARRYING OUT THE INVENTION

Figure 1:
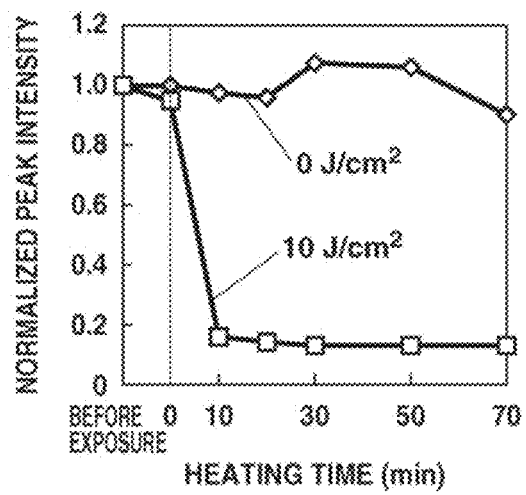
FIG. 1 is a graph showing the change over time in the FT-IR spectrum of the acid generating film produced in Working Example 1 when irradiated with 0 or 10 J/cm$^2$ of light having a wavelength of 365 nm and heated at 120° C.

The invention is described more fully below.
(1) Method of Producing Electroconductive Film and Electroconductive Pattern The inventive method of producing an electroconductive film includes the steps of: laminating an acid generating film that contains an acid proliferating agent and an acid generator onto an electrically conductive polymer-containing polymer film formed on a substrate so as to obtain a laminate; irradiating light onto the laminate from the acid generating film side thereof; doping the electrically conductive polymer with acid that is generated and proliferates within the acid generating film on account of light irradiation; and releasing the acid generating film from the polymer film.

In the lamination step, ways of laminating an acid-generating film onto a polymer film include, but are not particularly limited to, the method of laminating an acid generating film by applying, and drying, an acid generating film-forming composition on a polymer film; and the method of laminating, with a polymer film, an acid-generating film produced beforehand by applying, and drying, an acid-generating layer-forming composition on a substrate (support). Of these, it is preferable to use the latter method which, because it can be carried out in a dry state, does not give rise to problems such as erosion of the polymer film.

In the light irradiation step, the acid proliferating agent decomposes to form an acid due to a catalytic reaction triggered by acid generated by the photoacid generator, along with which acid within the acid-generating film proliferates due to an autocatalytic decomposition reaction prompted by the acid that arises from the acid proliferating agent itself.

The irradiating light is exemplified by radiation such as ultraviolet rays or visible light having a wavelength of 190 to 500 nm.

Examples of radiation light sources that may be used include low-pressure mercury vapor lamps, high-pressure mercury vapor lamps, ultrahigh-pressure mercury vapor lamps, metal halide lamps and argon gas lasers.

The radiation dose varies with such factors as the type and content of each ingredient and the thicknesses of the polymer film and the acid-generating film, and thus cannot be strictly specified. However, when a high-pressure mercury vapor lamp is used, the dose is typically from about 0.1 to about 15 J/cm$^2$.

In the doping step, the conductive polymer is doped with the acid that is generated and proliferates in the acid generating film on account of the aforementioned catalytic reaction.

In cases where an undoped electrically conductive polymer is used as the conductive polymer making up the polymer film, doping in this invention entails doping with acid (dopant) generated in the acid-generating film. On the other hand, when an electrically conductive polymer doped with acid (dopant) is used as the conductive polymer making up the polymer film, dopant exchange occurs between the acid that is the dopant in the conductive polymer and the acid generated within the acid-generating film.

In the method of the invention, there are also cases in which the light irradiation step and the doping step are carried out in parallel at the same time; that is, cases where, in the light irradiating step following the onset of light irradiation, the acid that proliferates due to decomposition of the acid proliferating agent (acid proliferation) migrates to the polymer film, giving rise to the above-described doping.

Also, in the light irradiating step and/or doping step in which doping of the conductive polymer must be made to proceed, heating may be used concomitantly or heating may be carried out after the above light irradiating step and/or doping step.

The heating temperature is not particularly limited, although from about 80 to about 150° C. is generally preferred, and from about 100 to about 130° C. is more preferred.

The heating time is preferably from about 5 to about 60 minutes, and more preferably from about 10 to about 50 minutes.

In the release step, the acid-generating film is released from the polymer film, thereby obtaining an electroconductive film that has been conferred with high electrical conductivity by doping in the doping step.

The release method is exemplified by, without particular limitation, methods that involve dipping in a stripping solution and physical release (peeling) methods. In this case as well, a physical release method is preferable because it can be carried out in a dry state.

To enhance this physical releasability, it is preferable to include a release agent in the acid generating film.

In the above electroconductive film production method, it is also possible to produce an electroconductive pattern having a desired pattern by carrying out, after the lamination step and before the light irradiation step, the step of masking the acid generating film.

More specifically, by carrying out light irradiation through a photomask having a desired pattern, because acid is generated and proliferates only in areas of the acid generating film that have received light irradiation and only those areas of the polymer film that are in contact with such light-irradiated areas (acid generating and proliferating areas) are doped and conferred with high electrical conductivity, a desired electroconductive pattern corresponding to the pattern shape in the photomask can be produced.

(2) Photoacid Generator

Photoacid generators that may be used in the acid-generating film are not particularly limited, provided they are compounds which receive irradiated light (radiation) and generate an acid. Exemplary photoacid generators include trichloromethyl-s-triazine compounds, diaryliodonium salts, triarylsulfonium salts and other sulfonium salts, quaternary ammonium salts and sulfonic acid esters.

Illustrative examples of trichloromethyl-s-triazine compounds include 2,4,6-tris(trichloromethyl)-s-triazine, 2-phenyl-4,6-bis(trichloromethyl)-s-triazine,
2-(4-chlorophenyl)-4,6-bis(trichloromethyl)-s-triazine,
2-(3-chlorophenyl)-4,6-bis(trichloromethyl)-s-triazine,
2-(2-chlorophenyl)-4,6-bis(trichloromethyl)-s-triazine,
2-(4-methoxyphenyl)-4,6-bis(trichloromethyl)-s-triazine,
2-(3-methoxyphenyl)-4,6-bis(trichloromethyl)-s-triazine,
2-(2-methoxyphenyl)-4,6-bis(trichloromethyl)-s-triazine,
2-(4-methylthiophenyl)-4,6-bis(trichloromethyl)-s-triazine,
2-(3-methylthiophenyl)-4,6-bis(trichloromethyl)-s-triazine,
2-(2-methylthiophenyl)-4,6-bis(trichloromethyl)-s-triazine,
2-(4-methoxynaphthyl)-4,6-bis(trichloromethyl)-s-triazine,
2-(3-methoxynaphthyl)-4,6-bis(trichloromethyl)-s-triazine,
2-(2-methoxynaphthyl)-4,6-bis(trichloromethyl)-s-triazine,
2-(4-methoxy-β-styryl)-4,6-bis(trichloromethyl)-s-triazine,
2-(3-methoxy-β-styryl)-4,6-bis(trichloromethyl)-s-triazine,
2-(2-methoxy-β-styryl)-4,6-bis(trichloromethyl)-s-triazine,
2-(3,4,5-trimethoxy-β-styryl)-4,6-bis(trichloromethyl)-s-triazine,
2-(4-methylthio-β-styryl)-4,6-bis(trichloromethyl)-s-triazine,
2-(3-methylthio-β-styryl)-4,6-bis(trichloromethyl)-s-triazine,
2-piperonyl-4,6-bis(trichloromethyl)-s-triazine,
2-[2-(furan-2-yl)ethenyl]-4,6-bis(trichloromethyl)-s-triazine,
2-[(E)-2-(3-methyl-2-furanyl)ethenyl]-4,6-di(trichloromethyl)-1,3,5-triazine,
2-[2-(5-methylfuran-2-yl)ethenyl]-4,6-bis(trichloromethyl)-s-triazine and
2-[2-(4-diethylamino-2-methylphenyl)ethenyl]-4,6-bis(trichloromethyl)-s-triazine.

Illustrative examples of diaryliodonium salts include
diphenyliodonium tetrafluoroborate,
diphenyliodonium hexafluorophosphonate,
diphenyliodonium hexafluoroarsenate,
diphenyliodonium trifluoromethanesulfonate,
diphenyliodonium trifluoroacetate,
diphenyliodonium p-toluenesulfonate,
diphenyliodonium butyltris(2,6-difluorophenyl)borate,
diphenyliodonium hexyltris(p-chlorophenyl)borate,
diphenyliodonium hexyltris(3-trifluoromethylphenyl)borate,
4-methoxyphenyliodonium tetrafluoroborate,
4-methoxyphenyliodonium hexafluorophosphonate,
4-methoxyphenylphenyliodonium hexafluoroarsenate,
4-methoxyphenylphenyliodonium trifluoromethanesulfonate,
4-methoxyphenylphenyliodonium trifluoroacetate,
4-methoxyphenylphenyliodonium p-toluenesulfonate,
4-methoxyphenylphenyliodonium butyltris(2,6-difluorophenyl)-borate,
4-methoxyphenylphenyliodonium hexyltris(p-chlorophenyl)borate,
4-methoxyphenylphenyliodonium hexyltris(3-trifluoromethyl-phenyl)borate,
bis(4-tert-butylphenyl)iodonium tetrafluoroborate,
bis(4-tert-butylphenyl)iodonium hexafluoroarsenate,
bis(4-tert-butylphenyl)iodonium trifluoromethanesulfonate,
bis(4-tert-butylphenyl)iodonium trifluoroacetate,
bis(4-tert-butylphenyl)iodonium p-toluenesulfonate,
bis(4-tert-butylphenyl)iodonium butyltris(2,6-difluorophenyl)-borate,
bis(4-tert-butylphenyl)iodonium hexyltris(p-chlorophenyl)borate,
bis(4-tert-butylphenyl)iodonium hexyltris(3-trifluoromethyl-phenyl)borate,
phenyl-4-(2'-hydroxy-1'-tetradecaoxy)phenyliodonium tetrafluoroborate,
phenyl-4-(2'-hydroxy-1'-tetradecaoxy)phenyliodonium trifluoromethanesulfonate and
4-(2'-hydroxy-1'-tetradecaoxy)phenyliodonium hexafluoroantimonate.

Illustrative examples of triarylsulfonium salts include
triphenylsulfonium tetrafluoroborate,
triphenylsulfonium hexafluorophosphonate,
triphenylsulfonium hexafluoroarsenate,
triphenylsulfonium trifluoromethanesulfonate,
triphenylsulfonium trifluoroacetate,
triphenylsulfonium p-toluenesulfonate,
triphenylsulfonium butyltris(2,6-difluorophenyl)borate,
triphenylsulfonium hexyltris(p-chlorophenyl)borate,
triphenylsulfonium hexyltris(3-trifluoromethylphenyl)borate,
4-methoxyphenyldiphenylsulfonium tetrafluoroborate,
4-methoxyphenyldiphenylsulfonium hexafluorophosphonate,
4-methoxyphenyldiphenylsulfonium hexafluoroarsenate,
4-methoxyphenyldiphenylsulfonium trifluoromethanesulfonate,
4-methoxyphenyldiphenylsulfonium trifluoroacetate,
4-methoxyphenyldiphenylsulfonium p-toluenesulfonate,
4-methoxyphenyldiphenylsulfonium butyltris(2,6-difluorophenyl)borate,
4-methoxyphenyldiphenylsulfonium hexyltris(p-chlorophenyl)-borate,
4-methoxyphenyldiphenylsulfonium hexyltris(3-trifluoromethyl-phenyl)borate,
4-phenylthiophenyldiphenylsulfonium tetrafluoroborate,
4-phenylthiophenyldiphenylsulfonium hexafluorophosphonate,
4-phenylthiophenyldiphenylsulfonium hexafluoroarsenate,
4-phenylthiophenyldiphenylsulfonium trifluoromethanesulfonate,
4-phenylthiophenyldiphenylsulfonium trifluoroacetate,
4-phenylthiophenyldiphenylsulfonium p-toluenesulfonate,
4-phenylthiophenyldiphenylsulfonium butyltris(2,6-difluoro-phenyl)borate,
4-phenylthiophenyldiphenylsulfonium hexyltris(p-chlorophenyl)borate,
4-phenylthiophenyldiphenylsulfonium hexyltris(3-trifluoromethylphenyl)borate,
4-hydroxy-1-naphthalenyldimethylsulfonium tetrafluoroborate,
4-hydroxy-1-naphthalenyldimethylsulfonium hexafluorophosphonate,
4-hydroxy-1-napthalenyldimethylsulfonium hexafluoroarsenate,
4-hydroxy-1-naphthalenyldimethylsulfonium trifluoromethanesulfonate,
4-hydroxy-1-naphthalenyldimethylsulfonium trifluoroacetate,
4-hydroxy-1-napthalenyldimethylsulfonium p-toluenesulfonate, 4-hydroxy-1-napthalenyldimethylsulfonium butyltris(2,6-difluorophenyl)borate,
4-hydroxy-1-naphthalenyldimethylsulfonium hexyltris(p-chloro-phenyl)borate and
4-hydroxy-1-naphthalenyldimethylsulfonium hexyltris(3-trifluoromethylphenyl)borate.

Illustrative examples of other sulfonium salts include
(4-hydroxy-1-naphthyl)dimethylsulfonium tetrafluoroborate,
(4-hydroxy-1-naphthyl)dimethylsulfonium hexafluorophosphonate,
(4-hydroxy-1-naphthyl)dimethylsulfonium hexafluoroarsenate,
(4-hydroxy-1-naphthyl)dimethylsulfonium trifluoromethanesulfonate,
(4-hydroxy-1-naphthyl)dimethylsulfonium nonafluorobutanesulfonate,
(4-hydroxy-1-naphthyl)dimethylsulfonium p-toluenesulfonate,
1-(2-naphthalen-2-yl-2-oxoethyl)thiolan-1-ium tetrafluoroborate,
1-(2-naphthalen-2-yl-2-oxoethyl)thiolan-1-ium hexafluorophosphonate,
1-(2-naphthalen-2-yl-2-oxoethyl)thiolan-1-ium hexafluoroarsenate,
1-(2-naphthalen-2-yl-2-oxoethyl)thiolan-1-ium trifluoromethanesulfonate,
1-(2-naphthalen-2-yl-2-oxoethyl)thiolan-1-ium trifluoronanafluorobutanesulfonate,
1-(2-naphthalen-2-yl-2-oxoethyl)thiolan-1-ium p-toluenesulfonate,
(4-hydroxy-1-naphthyl)dimethylsulfonium tetrafluoroborate,
(4-hydroxy-1-naphthyl)dimethylsulfonium hexafluorophosphonate,
(4-hydroxy-1-naphthyl)dimethylsulfonium hexafluoroarsenate,
(4-hydroxy-1-naphthyl)dimethylsulfonium trifluoromethanesulfonate,
(4-hydroxy-1-naphthyl)dimethylsulfonium nonafluorobutanesulfonate,
(4-hydroxy-1-naphthyl)dimethylsulfonium p-toluenesulfonate,
(4,7-dihydroxy-1-naphthyl)dimethylsulfonium tetrafluoroborate,
(4,7-dihydroxy-1-naphthyl)dimethylsulfonium hexafluorophosphonate,
(4,7-dihydroxy-1-naphthyl)dimethylsulfonium hexafluoroarsenate,
(4,7-dihydroxy-1-naphthyl)dimethylsulfonium trifluoromethanesulfonate,
(4,7-dihydroxy-1-naphthyl)dimethylsulfonium nonafluorobutanesulfonate,
(4,7-dihydroxy-1-naphthyl)dimethylsulfonium p-toluenesulfonate,
(4,8-dihydroxy-1-naphthyl)dimethylsulfonium tetrafluoroborate,
(4,8-dihydroxy-1-naphthyl)dimethylsulfonium hexafluorophosphonate,
(4,8-dihydroxy-1-naphthyl)dimethylsulfonium hexafluoroarsenate,
(4,8-dihydroxy-1-naphthyl)dimethylsulfonium trifluoromethanesulfonate,
(4,8-dihydroxy-1-naphthyl)dimethylsulfonium nonafluorobutanesulfonate,
(4,8-dihydroxy-1-naphthyl)dimethylsulfonium p-toluenesulfonate,
1-(4,7-hydroxy-1-naphthyl)thiolan-1-ium tetrafluoroborate,
1-(4,7-hydroxy-1-naphthyl)thiolan-1-ium hexafluorophosphonate,
1-(4,7-hydroxy-1-naphthyl)thiolan-1-ium hexafluoroarsenate,
1-(4,7-dibutoxy-1-naphthyl)thiolan-1-ium trifluoromethanesulfonate,
1-(4,7-hydroxy-1-naphthyl)thiolan-1-ium nonafluorobutanesulfonate,
1-(4,7-hydroxy-1-naphthyl)thiolan-1-ium p-toluenesulfonate,
1-(4,7-dibutoxy-1-naphthyl)thiolan-1-ium tetrafluoroborate,
1-(4,7-dibutoxy-1-naphthyl)thiolan-1-ium hexafluorophosphonate,
1-(4,7-dibutoxy-1-naphthyl)thiolan-1-ium hexafluoroarsenate,
1-(4,7-dibutoxy-1-naphthyl)thiolan-1-ium nonafluorobutanesulfonate and
1-(4,7-dibutoxy-1-naphthyl)thiolan-1-ium p-toluenesulfonate.

Illustrative examples of quaternary ammonium salts include
tetramethylammonium tetrafluoroborate,
tetramethylammonium hexafluorophosphonate,
tetramethylammonium hexafluoroarsenate,
tetramethylammonium trifluoromethanesulfonate,
tetramethylammonium trifluoroacetate,
tetramethylammonium p-toluenesulfonate,
tetramethylammonium butyltris(2,6-difluorophenyl)borate,
tetramethylammonium hexyltris(p-chlorophenyl)borate,
tetramethylammonium hexyltris(3-trifluoromethylphenyl)borate,
tetrabutylammonium tetrafluoroborate,
tetrabutylammonium hexafluorophosphonate,
tetrabutylammonium hexafluoroarsenate,
tetrabutylammonium trifluoromethanesulfonate,
tetrabutylammonium trifluoroacetate,
tetrabutylammonium p-toluenesulfonate,
tetrabutylammonium butyltris(2,6-difluorophenyl)borate,
tetrabutylammonium hexyltris(p-chlorophenyl)borate,
tetrabutylammonium hexyltris(3-trifluoromethylphenyl)borate,
benzyltrimethylammonium tetrafluoroborate,
benzyltrimethylammonium hexafluorophosphonate,
benzyltrimethylammonium hexafluoroarsenate,
benzyltrimethylammonium trifluoromethanesulfonate,
benzyltrimethylammonium trifluoroacetate,
benzyltrimethylammonium p-toluenesulfonate,
benzyltrimethylammonium butyltris(2,6-difluorophenyl)borate,
benzyltrimethylammonium hexyltris(p-chlorophenyl)borate,
benzyltrimethylammonium hexyltris(3-trifluoromethylphenyl)-borate,
benzyldimethylphenylammonium tetrafluoroborate,
benzyldimethylphenylammonium hexafluorophosphonate,
benzyldimethylphenylammonium hexafluoroarsenate,
benzyldimethylphenylammonium trifluoromethanesulfonate,
benzyldimethylphenylammonium trifluoroacetate,
benzyldimethylphenylammonium p-toluenesulfonate,
benzyldimethylphenylammonium butyltris(2,6-difluorophenyl)-borate,
benzyldimethylphenylammonium hexyltris(p-chlorophenyl)borate,
benzyldimethylphenylammonium hexyltris(3-trifluoromethylphenyl)borate, N-cinnamylideneethylphenylammonium tetrafluoroborate,
N-cinnamylideneethylphenylammonium hexafluorophosphonate,
N-cinnamylideneethylphenylammonium hexafluoroarsenate,
N-cinnamylideneethylphenylammonium trifluoromethanesulfonate,
N-cinnamylideneethylphenylammonium trifluoroacetate,
N-cinnamylideneethylphenylammonium p-toluenesulfonate,
N-cinnamylideneethylphenylammonium butyltris(2,6-difluoro-phenyl)borate,
N-cinnamylideneethylphenylammonium hexyltris(p-chlorophenyl)-borate and
N-cinnamylideneethylphenylammonium hexyltris(3-trifluoro-methylphenyl)borate.

Illustrative examples of sulfonic acid esters include
α-hydroxymethylbenzoin p-toluenesulfonic acid ester,
α-hydroxymethylbenzoin trifluoromethanesulfonic acid ester,
α-hydroxymethylbenzoin methanesulfonic acid ester,
pyrogallol tri(p-toluenesulfonic acid) ester,
pyrogallol tri(trifluoromethanesulfonic acid) ester,
pyrogallol trimethanesulfonic acid ester,
2,4-dinitrobenzyl p-toluenesulfonic acid ester,
2,4-dinitrobenzyl trifluoromethanesulfonic acid ester,
2,4-dinitrobenzyl methanesulfonic acid ester,
2,4-dinitrobenzyl 1,2-naphthoquinonediazido-5-sulfonic acid ester,
2,6-dinitrobenzyl p-toluenesulfonic acid ester,
2,6-dinitrobenzyl trifluoromethanesulfonic acid ester,
2,6-dinitrobenzyl methanesulfonic acid ester,
2,6-dinitrobenzyl 1,2-naphthoquinonediazido-5-sulfonic acid ester,
2-nitrobenzyl p-toluenesulfonic acid ester,
2-nitrobenzyl trifluoromethanesulfonic acid ester,
2-nitrobenzyl methanesulfonic acid ester,
2-nitrobenzyl 1,2-naphthoquinonediazido-5-sulfonic acid ester,
4-nitrobenzyl p-toluenesulfonic acid ester,
4-nitrobenzyl trifluoromethanesulfonic acid ester,
4-nitrobenzyl methanesulfonic acid ester,
4-nitrobenzyl 1,2-naphthoquinonediazido-5-sulfonic acid ester,
N-hydroxynaphthalimide p-toluenesulfonic acid ester (also referred to below as p-toluenesulfonic acid-1,8-naphthalimide),
N-hydroxynaphthalimide trifluoromethanesulfonic acid ester, N-hydroxynaphthalimide methanesulfonic acid ester,
N-hydroxy-5-norbornene-2,3-dicarboxylmide p-toluenesulfonic acid ester,
N-hydroxy-5-norbornene-2,3-dicarboxyimide trifluoromethanesulfonic acid ester,
N-hydroxy-5-norbornene-2,3-dicarboxylmide methanesulfonic acid ester,
2,4,6,3',4',5'-hexahydroxybenzophenone 1,2-naphthoquinonediazido-4-sulfonic acid ester and
1,1,1-tri(p-hydroxyphenyl)ethane 1,2-naphthoquinonediazido-4-sulfonic acid ester.

These photoacid generators may be used singly, or two or more may be used in combination.

Of these, taking into account the balance of solubility in the organic solvent and the acid generating ability, an organic sulfonic acid ester derived from an organic sulfonic acid and an alcohol is preferred, an aryl sulfonic acid ester derived from an aryl sulfonic acid and an alcohol having an aryl group on the molecule is more preferred, and a naphthalimide aryl sulfonic acid ester derived from N-hydroxynaphthalimide and an aryl sulfonic acid is even more preferred.

Preferred examples include 2,6-dinitrobenzyl p-toluenesulfonic acid ester, 2,6-dinitrobenzyl trifluoromethanesulfonic acid ester, p-toluenesulfonic acid-1,8-naphthalimide and N-hydroxynaphthalimide trifluoromethanesulfonic acid ester, with p-toluenesulfonic acid-1,8-naphthalimide being most preferred.

(3) Acid Proliferating Agent

The acid proliferating agent also is not particularly limited. However, taking into account the balance between solubility in organic solvents and the acid proliferating ability, an organic sulfonic acid ester derivative derived from an organic sulfonic acid and an alcohol is preferred.

Illustrative examples of organic sulfonic acid ester derivatives include
cyclohexyl p-toluenesulfonate, cyclohexyl benzenesulfonate,
cyclohexyl o-nitrobenzenesulfonate,
cyclohexyl m-nitrobenzenesulfonate,
cyclohexyl p-nitrobenzenesulfonate,
cyclohexyl β-naphthalenesulfonate,
cyclohexyl methanesulfonate,
2-methylcyclohexyl p-toluenesulfonate,
2-methylcyclohexyl benzenesulfonate,
2-methylcyclohexyl o-nitrobenzenesulfonate,
2-methylcyclohexyl m-nitrobenzenesulfonate,
2-methylcyclohexyl p-nitrobenzenesulfonate,
2-methylcyclohexyl 1-naphthalenesulfonate,
2-methylcyclohexyl 2-naphthalenesulfonate,
2-methylcyclohexyl methanesulfonate,
2-cyclohexylcyclohexyl p-toluenesulfonate,
2-cyclohexylcyclohexyl benzenesulfonate,
2-cyclohexylcyclohexyl o-nitrobenzenesulfonate,
2-cyclohexylcyclohexyl m-nitrobenzenesulfonate,
2-cyclohexylcyclohexyl p-nitrobenzenesulfonate,
2-cyclohexylcyclohexyl 1-naphthalenesulfonate,
2-cyclohexylcyclohexyl 2-naphthalenesulfonate,
2-cyclohexylcyclohexyl methanesulfonate,
4-(tert-butyl)cyclohexyl p-toluenesulfonate,
4-(tert-butyl)cyclohexyl benzenesulfonate,
4-(tert-butyl)cyclohexyl o-nitrobenzenesulfonate,
4-(tert-butyl)cyclohexyl m-nitrobenzenesulfonate,
4-(tert-butyl)cyclohexyl p-nitrobenzenesulfonate,
4-(tert-butyl)cyclohexyl 1-naphthalenesulfonate,
4-(tert-butyl)cyclohexyl 2-naphthalenesulfonate,
4-(tert-butyl)cyclohexyl methanesulfonate,
1,3-cyclohexylene bis(p-toluenesulfonate) (also referred to below as 1,4-cyclohexanediol di-p-toluenesulfonate),
1,3-cyclohexylene bis(benzenesulfonate),
1,3-cyclohexylene bis(o-nitrobenzenesulfonate),
1,3-cyclohexylene bis(m-nitrobenzenesulfonate),
1,3-cyclohexylene bis(p-nitrobenzenesulfonate),
1,3-cyclohexylene bis(1-naphthalenesulfonate),
1,3-cyclohexylene bis(2-naphthalenesulfonate),
1,3-cyclohexylene bis(methanesulfonate),
1,4-cyclohexylene bis(p-toluenesulfonate),
1,4-cyclohexylene bis(benzenesulfonate),
1,4-cyclohexylene bis(o-nitrobenzenesulfonate),
1,4-cyclohexylene bis(m-nitrobenzenesulfonate),
1,4-cyclohexylene bis(p-nitrobenzenesulfonate),
1,4-cyclohexylene bis(β-naphthalenesulfonate),
1,4-cyclohexylene bis(methanesulfonate),
2,3-butylene bis(p-toluenesulfonate),
2,3-butylene bis(benzenesulfonate), 2,3-butylene bis(o-nitrobenzenesulfonate),
2,3-butylene bis(m-nitrobenzenesulfonate),
2,3-butylene bis(p-nitrobenzenesulfonate),
2,3-butylene bis(β-naphthalenesulfonate),
2,3-butylene bis(methanesulfonate),
diphenylmethane p-toluenesulfonate,
diphenylmethane benzenesulfonate,
diphenylmethane o-nitrobenzenesulfonate,
diphenylmethane m-nitrobenzenesulfonate,
diphenylmethane p-nitrobenzenesulfonate,
diphenylmethane β-naphthalenesulfonate,
diphenylmethane methanesulfonate,
1-phenylethyl p-toluenesulfonate,
1-phenylethyl benzenesulfonate,
1-phenylethyl o-nitrobenzenesulfonate,
1-phenylethyl m-nitrobenzenesulfonate,
1-phenylethyl p-nitrobenzenesulfonate,
1-phenylethyl 1-naphthalenesulfonate,
1-phenylethyl 2-naphthalenesulfonate,
1-phenylethyl methanesulfonate,
4-cyclohexylcyclohexyl benzenesulfonate,
2-phenyl-1,3-dioxan-5-yl benzenesulfonate,
2,3-dihydroinden-2-yl benzenesulfonate and
the acid proliferating agents mentioned in, for example, JP-A 2014-47329.

These acid proliferating agents may be used singly, or two or more may be used in combination.

Of these, 1,4-cyclohexanediol di-p-toluenesulfonate, 1,3-cyclohexylene bis(benzenesulfonate), 1,3-cyclohexylene bis(o-nitrobenzenesulfonate), 1,3-cyclohexylene bis(m-nitrobenzenesulfonate), 1,3-cyclohexylene bis(p-nitrobenzenesulfonate), 1,3-cyclohexylene bis(1-naphthalenesulfonate), 1,3-cyclohexylene bis(2-naphthalenesulfonate), 1,3-cyclohexylene bis(methanesulfonate), 1,4-cyclohexylene bis(p-toluenesulfonate), 1,4-cyclohexylene bis(benzenesulfonate), 1,4-cyclohexylene bis(o-nitrobenzenesulfonate), 1,4-cyclohexylene bis(m-nitrobenzenesulfonate), 1,4-cyclohexylene bis(p-nitrobenzenesulfonate), 1,4-cyclohexylene bis(β-naphthalenesulfonate) and 1,4-cyclohexylene bis(methanesulfonate) are preferred. 1,4-cyclohexanediol di-p-toluenesulfonate is even more preferred.

The organic sulfonic acid ester derivative may be one that is synthesized in the usual manner from the corresponding organic sulfonic acid or organic sulfonyl halide and an alcohol, or may be acquired as a commercial product.

Illustrative examples of organic sulfonic acids include benzenesulfonic acid, p-toluenesulfonic acid, 4-bromobenzenesulfonic acid, 4-methoxybenzenesulfonic acid, 4-benzyloxybenzenesulfonic acid, 1-naphthylsulfonic acid, 2-naphthylsulfonic acid, 1,3-benzenedisulfonic acid, methanesulfonic acid, ethanesulfonic acid, 2-nitrobenzenesulfonic acid, 3-nitrobenzenesulfonic acid and 4-nitrobenzenesulfonic acid.

Illustrative examples of alcohols include methanol, ethanol, propanol, isopropanol, 2-phenylethanol, 1-phenylpropanol, butanol, isobutanol, sec-butanol, tert-butanol, amyl alcohol, cyclohexanol, 2-methylcyclohexanol, 4-methylcyclohexanol, 4-(tert-butyl)cyclohexanol, 2-cyclohexylcyclohexanol, 4-cyclohexylcyclohexanol, 2,6-dimethylcyclohexanol, benzhydrol, 1-phenylethanol, 2,3-dihydroinden-2-ol, 2-phenyl-1,3-dioxan-5-ol, ethylene glycol, diethylene glycol, propylene glycol, 2,2-dimethyl-1,3-propanediol, 1,4-butanediol, 2,3-butanediol, 2,5-hexanediol, 1,2-cyclohexanediol, 1,3-cyclohexanediol, 1,4-cyclohexanediol and 2,2-bis(4-cyclohexyl)propane.

The organic sulfonyl halide may be synthesized in the usual manner, such as by reacting an organic sulfonic acid with a halogenating agent, or a commercial product may be used.

(4) Release Agent

The release agent is an agent for facilitating release from the polymer film, and is exemplified by silicone-based release agents and fluorocarbon-based release agents. These can be acquired as commercial products.

Illustrative examples include Optool DSC (Daikin Industries, Ltd.) and Novec EGC-1720 (Sumitomo 3M Ltd.).

(5) Acid Generating Layer-Forming Composition and Method of Producing Acid-Generating Film The acid generating layer-forming composition according to this invention includes a photoacid generator, an acid proliferating agent and, optionally, a release agent.

In this composition, the ratio between the content of photoacid generator and the content of acid proliferating agent is not particularly limited, although the ratio of photoacid generator to acid proliferating agent is preferably from about 1:1 to about 1:100, and more preferably from about 1:5 to about 1:30.

When a release agent is used, the content thereof is not particularly limited. However, to generate a sufficient release action, the release agent is used in a weight ratio, relative to unity (1) for the combined weight of the photoacid generator and the acid proliferating agent, which is preferably from about 0.1 to 100, more preferably from about 0.5 to about 50, and even more preferably from about 1 to about 10.

Where necessary, an organic solvent may be included in the acid generating layer-forming composition of the invention.

An organic solvent suitable for the materials used may be selected for use. Illustrative examples include amides such as N,N-dimethylformamide (DMF), N,N-dimethylacetamide (DMAc) and N-methyl-2-pyrrolidone (NMP); ketones such as acetone, methyl ethyl ketone, methyl isobutyl ketone and cyclohexanone; alcohols such as methanol, ethanol, isopropanol and n-propanol; haloalcohols such as 1,1,1,3,3,3-hexafluoro-2-propanol; aliphatic hydrocarbons such as n-heptane, n-hexane and cyclohexane; aromatic hydrocarbons such as benzene, toluene, xylene and ethylbenzene; glycol ethers such as ethylene glycol monoethyl ether, ethylene glycol monobutyl ether and propylene glycol monomethyl ether; and glycols such as ethylene glycol and propylene glycol. These organic solvents may be used singly, or two or more may be used in combination.

The amount of organic solvent used is not particularly limited. However, in terms of, for example, the ease of application, the solids concentration of the photoacid generator, etc. is preferably from about 0.1 to about 20 wt %, and more preferably from 0.5 to 10 wt %.

As described above, the acid-generating film used in the production method of the invention is produced by coating the above acid generating layer-forming composition onto a polymer film or a substrate (support) and then heating, thereby evaporating off the solvent when a solvent is included.

The method of applying the composition used in this case, although not particularly limited, is exemplified by dipping, spin coating, transfer printing, roll coating, brush coating, inkjet printing and spraying. The viscosity and surface tension of the composition is preferably adjusted in accordance with these methods of application.

The heating atmosphere also is not particularly limited. That is, heating may be carried out in an open-air atmosphere or within an inert gas such as nitrogen or in a vacuum.

The heating temperature is suitably set within the range of about 50 to 150° C. while taking into account, for example, the boiling point of the solvent and the decomposition temperature of the material.

During heating, a temperature change in two or more steps may be applied for such purposes as to achieve more uniform film formability. Heating may be carried out using a suitable apparatus such as a hot plate or an oven.

The thickness of the acid generating film is not particularly limited, but generally is suitably set in the range of 0.1 to 30 μm.

When the acid generating film is directly formed on the polymer film, it is preferable to select materials and solvents such that the polymer, etc. within the polymer film do not dissolve out into the composition for forming the acid generating layer.

On the other hand, when the acid generating film is formed on a support, to efficiently promote acid generation and proliferation in the subsequent light irradiation step, it is essential for a transparent material having a good optical transparency such as glass to be used as the support material.

(6) Polymer Film-Forming Composition

The polymer film used in this invention can be produced using a polymer film-forming composition that contains a hitherto known electrically conductive polymer.

Here, the electrically conductive polymer may be one which exhibits electrical conductivity when doped with a dopant substance, or may be one that itself has electrical conductivity.

The electrically conductive polymer is not particularly limited, provided it is a polymer having electrical conductivity in the above-described sense; it may be a commercially available product or may be one produced by polymerizing specific monomers. Typical examples are polymers made up of a single type of monomer unit or two or more types of monomers units selected from among aniline derivatives, pyrrole derivatives and thiophene derivatives that are combined and connected in any order. Illustrative examples include polyaniline, polypyrrole and polythiophene.

Of these, in terms of the balance between electrical conductivity and ready availability, a polythiophene is preferred, and poly(3,4-ethylenedioxythiophene) is more preferred.

Illustrative examples of the aniline derivative used as the monomer include aniline, 2,3-diphenylaniline and 3-aminoquinoxaline.

Illustrative examples of pyrrole derivatives include 3-alkylpyrroles such as 3-hexylpyrrole, 3,4-dialkylpyrroes such as 3,4-dihexylpyrrole, 3-alkoxypyrroles such as 3-methoxypyrrole, and 3,4-dialkoxypyrroles such as 3,4-dimethoxypyrrole.

Illustrative examples of thiophene derivatives include 3,4-ethylenedioxythiophene and derivatives thereof, such as 3,4-(1-hexyl)ethylenedioxythiophene, 3-alkylthiophenes such as 3-hexylthiophene, and 3-alkoxythiophenes such as 3-methoxythiophene.

These monomers may be of one type used alone, or combinations of two or more types may be used.

The method of producing the electrically conductive polymer (polymer film-forming composition) is exemplified by the technique of chemically oxidizing and polymerizing various types of monomers in a solvent, using an oxidizing agent and at from about 0 to about 100° C. At this time, the subsequently described dopant substances may be included beforehand in the reaction system.

The solvent is suitably selected while taking into account the compatibility with the monomers and the oxidizing agent. For example, use can be made of the following: water; and organic solvents, including alcohol-type solvents such as methanol, ethanol and propanol, and low-polarity solvents such as acetonitrile, acetone and dimethylsulfoxide.

These solvents may be used singly, or combinations of two or more types may be used.

The oxidizing agent is suitably selected while taking into account such factors as the reactivity with the monomer. Exemplary oxidizing agents include iron(III) salts of inorganic acids, such as iron(III) chloride hexahydrate; copper (II) salts of inorganic acids, such as copper(II) chloride; nitrosonium tetrafluoroborate; persulfate such as ammonium persulfate; iron(III) salts of organic acids, such as iron(III) p-toluenesulfonate; hydrogen peroxide, and iodine. These may be used singly, or two or more may be used in combination.

The amount of oxidizing agent used is suitably set in the range of 0.5 to 100 parts by weight per part by weight of monomer while taking into account, for example, the types of monomer and solvent.

Illustrative examples of commercially available conductive polymers (polymer film-forming compositions) include Clevios™ F010, Clevios™ F020, Clevios™ F100T, Clevios™ F141M, Clevios™ F50T, Clevios™ CPP105D, Clevios™ HC Solar, Clevios™ PVA, Clevios™ FAS, Clevios™ FAS8, Clevios™ FE, Clevios™ FE T, Clevios™ M V2, Clevios™ P, Clevios™ P HC V4, Clevios™ P Jet (OLED), Clevios™ P Jet 700, Clevios™ P Jet HC, Clevios™ P Jet HC V2, Clevios™ P Jet N, Clevios™ P Jet N V2, Clevios™ P Jet UA, Clevios™ P T2, Clevios™ P VP A14083, Clevios™, Clevios™ P VP CH8000, Clevios™ PH, Clevios™ 1000, Clevios™ PH500, Clevios™ PH1000 and Clevios™ PH510 (all from Heraeus Group); R-iCP™ iCP150, R-iCP™ iCP150H, R-iCP™ iCP500 and R-iCP™ iCP500H (all from Nano Sol-tech Corporation); Orgacon™ HIL-1005, Orgacon™ IJ-1005, Orgacon™ 5305, Orgacon™ EL-P 5015 and Orgacon™ N-1005 (all from Sigma-Aldrich); Plexcore OS1100, Plexcore OS1110, Plexcore OS1115, Plexcore OS1150, Plexcore OS115, Plexcore OS1200 and Plexcore OS2100 (all from Plextronics); Enocoat BP-105 and Enocoat BP-200 (from Kaken Sangyo KK); and CDP-310M (from Japan Carlit Co., Ltd.).

The average molecular weight of the conductive polymer used in this invention is not particularly limited. However, taking into account, for example, the ease of application and the thin-film formability, the weight-average molecular weight is preferably from 1,000 to 2,000,000, and more preferably from 2,000 to 1,000,000.

The weight-average molecular weight in this invention is a measured value (polystyrene equivalent) obtained by gel permeation chromatography.

The polymer film-forming composition used in this invention may include a dopant substance. Typical dopant substances include sulfonic acid compounds and their salts.

Illustrative examples of sulfonic acid compounds include the following low-molecular weight sulfonic acid compounds: alkylsulfonic acid compounds such as 2-acrylamido-2-methylpropanesulfonic acid, benzenesulfonic acid compounds such as phenolsulfonic acid, styrenesulfonic acid, toluenesulfonic acid and dodecylbenzenesulfonic acid, naphthalenesulfonic acid compounds such as 1-naphthalenesulfonic acid, 2-naphthalenesulfonic acid, 1,3-naphthalenedisulfonic acid, 1,3,6-naphthalenetrisulfonic acid and 6-ethyl-1-naphthalenesulfonic acid, and anthraquinonesulfonic acid compounds; and polysulfonic acid compounds such as polyvinylsulfonic acid and polystyrenesulfonic acid.

A solvent may be optionally included in the polymer film-forming composition used in the invention.

Illustrative examples of solvents include water; and following organic solvents: amides such as N,N-dimethylformamide (DMF), N,N-dimethylacetamide (DMAc) and N-methyl-2-pyrrolidone (NMP); ketones such as acetone, methyl ethyl ketone, methyl isobutyl ketone and cyclohexanone; alcohols such as methanol, ethanol, isopropanol and n-propanol; aliphatic hydrocarbons such as n-heptane, n-hexane and cyclohexane; aromatic hydrocarbons such as benzene, toluene, xylene and ethylbenzene; glycol ethers such as ethylene glycol monoethyl ether, ethylene glycol monobutyl ether and propylene glycol monomethyl ether; and glycols such as ethylene glycol and propylene glycol. These solvents may be used singly, or two or more may be used in combination.

When a solvent is included, the conductive polymer within the composition may be dissolved in a solvent or may be dispersed.

The polymer film used in this invention is produced by applying the polymer film-forming composition onto a substrate and then heating, thereby evaporating off the solvent when the composition includes a solvent.

The substrate on which the polymer film is formed may be, for example, a glass substrate, an indium-tin oxide (ITO) substrate or an indium-zinc oxide (IZO) substrate, may be a substrate made of metal or a metal oxide, or may be a substrate made of resin, provided the resin does not dissolve out into the solvent within the composition, leading to adverse effects.

The heating temperature is suitably set in the range of about 50° C. to about 200° C. based on such considerations as the intended use of the resulting thin film, the properties to be imparted to the resulting thin film, and the boiling point of the solvent used.

The method of applying the composition, the heating environment, the heating apparatus and the like are the same as the conditions when producing the acid-generating film.

The thickness of the polymer film, although not particularly limited, is suitably set in the range of typically from 0.1 to 10 μm.

The acid-generating layer-forming composition of the invention can be advantageously used alone as a composition for doping various hitherto known electrically conductive polymer films or as a composition for pattern formation. However, by preparing a kit that separately includes both this polymer film-forming composition and an acid-generating layer-forming composition, the desired polymer film and an acid-generating film suitable for the polymer film can be efficiently produced, enabling an electroconductive film or an electroconductive pattern to be more efficiently and simply produced.

In particular, by preparing an electroconductive film or electroconductive pattern producing kit which is made up of two compositions: a polymer film-forming composition containing poly(3,4-ethylenedioxythiophene) as the electrically conductive polymer; and an acid generating layer-forming composition which includes as the acid proliferating agent a compound that generates an alkyl or aryl sulfonic acid via acid catalysis, and includes as the photoacid generator a naphthaleneimide-type photoacid generator, preferably a naphthaleneimide-aryl sulfonic acid ester, dry photopatterning can be efficiently and simply carried out, which is the main object of the invention.

The embodiment that involves laminating together a polymer film and an acid generating film, and doping the conductive polymer within the polymer film with acid that is generated and proliferates within the acid-generating film was explained above. By irradiating with light a single-layer film produced from a composition containing a conductive polymer, an acid proliferating agent and a photoacid generator, the conductive polymer is doped by acid that is generated and proliferates within the single-layer film, enabling an electroconductive film to be produced.

At this time, by carrying out light irradiation through a photomask, an electroconductive pattern can be produced in which only the light-irradiated areas have been doped and become areas of high electrical conductivity.

That is, the technique, distinctive to this invention, of using acid that is generated and proliferates from a photoacid generator and an acid proliferating agent on account of light irradiation to dope an electrically conductive polymer can be employed both in cases where the conductive polymer is rendered into one film and the photoacid generator and acid proliferating agent are rendered into another film, and also in cases where they are rendered into a single-layer film containing all of these ingredients.

EXAMPLES

Working Examples are given below to more concretely illustrate the invention, although the invention is not limited by these Examples. The instruments used in the Examples were as follows.

[1] FT-IR Spectroscopy

Measurement was carried out using a FT/IR-6100 from JASCO Corporation

[2] Measurement of Electrical Conductivity

The electrical conductivities of thin films (film thicknesses, 0.1 to 10 μm; spin coating conditions, 300 to 5,000 rpm) produced using a spin coater were measured using a resistivity meter (Loresta GP MCP-T610, from Mitsubishi Chemical Analytech Co., Ltd.).

[Working Example 1] Production of Acid Generating Layer-Forming Composition

A hexafluoro-2-propanol (HFIP) solution (solids concentration, 4 wt %) was prepared in which were mixed, with respect to the release agent Optool DSX (Daikin Industries, Ltd.): 53 wt % of the acid proliferating agent 1,4-cyclohexanediol di-p-toluenesulfonate, and 25 wt % of the photoacid generator p-toluenesulfonic acid-1,8-naphthalimide (Midori Kagaku Co., Ltd.).

[Decomposition Behavior of Acid Proliferating Agent in Release Agent]

The solution prepared earlier was spin-coated onto a silicon wafer and subjected to a 3-minute pre-bake at 100° C., thereby forming a film. This was irradiated with 0 or 10 J/cm² of 365 nm light, and the change in FT-IR spectrum when heated at 120° C. for 0 to 70 minutes was followed. The results are shown in FIG. 1.

In FT-IR spectroscopy, the change with heating in the intensity of the peak attributable to S—O bonds on the acid proliferating agent was followed. As shown in FIG. 1, in cases where acid was generated by light irradiation, the peak intensity rapidly decreased. By contrast, in cases where light irradiation was not carried out, a decrease was not observed even with 70 minutes of heating.

It is apparent from this that the acid proliferating agent is effectively dissolved by acid generated from the photoacid generator in the release agent.

[Working Example 2] Production of Electroconductive Film

A 1.3 wt % PEDOT:PSS aqueous dispersion (Clevios™ PH1000, from Heraeus Group) was spin-coated onto a glass substrate and pre-baked at 100° C. for 5 minutes, thereby producing a transparent polymer film.

In a separate procedure, an acid generating film was produced by spin-coating onto another glass substrate an HFIP solution having mixed therein, with respect to Optool DSX (Daikin Industries, Ltd.), 25 wt % of p-toluenesulfonic acid-1,8-naphthalimide and 53 wt % of 1,4-cyclohexanediol di-p-toluenesulfonate, and pre-baking at 100° C. for 3 minutes.

The acid generating film was laminated onto the transparent polymer film, irradiated with 0 or 10 J/cm$^2$ of 365 nm light, and the conductivity when heated at 120° C. for 0 to 60 minutes was measured by the four-point probe method.

Figure 2:
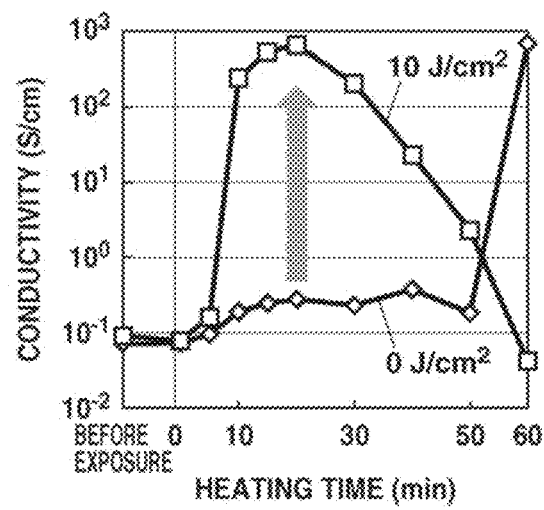
FIG. 2 is a graph showing the change over time in the electrical conductivity of the electroconductive film produced in Working Example 2 when irradiated with 0 or 10 J/cm$^2$ of light having a wavelength of 365 nm and heated at 120° C.

As shown in FIG. 2, in a transparent electroconductive film obtained by laminating the acid generating film onto the transparent polymer film and then irradiating with light and heating, the conductivity rises with the heating time; the conductivity when heated for 20 minutes has risen 1,000-fold compared with when not exposed to light. The reason is presumably that, with acid generated from the photoacid generator serving as a trigger, the acid proliferating agent consecutively decomposes, giving rise to dopant exchange between the TsOH that increases within the system and the PSS in the PEDOT:PSS dispersion.

[Working Example 3] Production of Electroconductive Pattern

Figure 3:
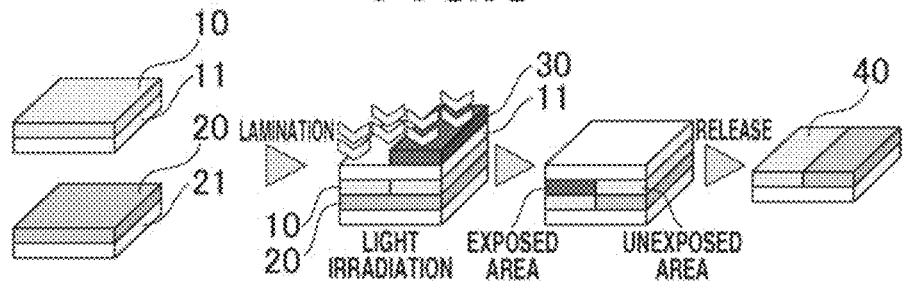
FIG. 3 is a schematic diagram of the dry photopatterning process in Working Example 3.
Figure 4:
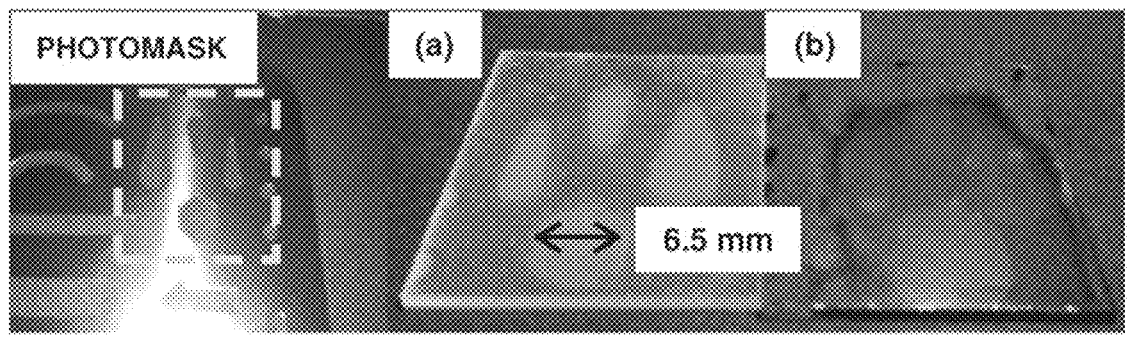
FIG. 4 is an image showing the pattern formed in Working Example 3.

As shown in FIG. 3, after laminating the acid generating film 10 onto the polymer film 20 in the same way as in Working Example 2, patterning was carried out by placing a photomask 30 having the shape shown in FIG. 4 against the glass substrate (support) 11 on the acid generating film 10 side as shown in FIG. 3, irradiating the laminate with 10 J/cm$^2$ of light having a wavelength of 365 nm, and heating at 120° C. for 20 minutes.

Following pattern formation, the acid generating film 10 was removed and the electroconductive film was examined. As shown in FIG. 4(b), the pattern 40 was observed to have transferred to the electroconductive film.

The above demonstrates that dry photopatterning of a PEDOT:PSS transparent electroconductive film is possible by using an acid generating film that incorporates a photoacid generating reaction and an acid proliferating reaction.

REFERENCE SIGNS LIST

10 Acid generating film
11 Glass substrate (support)
20 Polymer film
21 Glass substrate (substrate)
30 Photomask
40 Electroconductive pattern

The invention claimed is:

1. A method of producing an electroconductive film, which method is characterized by comprising the steps of:
    laminating an acid generating film that is produced beforehand on a support by applying, and drying, an acid-generating layer-forming composition onto an electrically conductive polymer-containing polymer film formed on a substrate so as to obtain a laminate, wherein the acid generating film composition comprises an acid proliferating agent, an acid generator and a release agent;
    irradiating light onto the laminate from the acid generating film side thereof;
    doping the electrically conductive polymer with acid that is generated and proliferates within the acid generating film on account of the light irradiation; and
    physically releasing the acid generating film from the polymer film in a dry state;
    wherein the method does not comprise the step of developing the acid generating film.

2. The electroconductive film production method of claim 1 which further comprises, after the lamination step and before the light irradiation step, a step of masking the acid generating film.

3. The electroconductive film production method of claim 1, wherein the acid generator comprises at least one selected from the group consisting of 2,6-dinitrobenzyl p-toluenesulfonic acid ester, 2,6-dinitrobenzyl trifluoromethanesulfonic acid ester, p-toluenesulfonic acid-1,8-naphthalimide and N-hydroxynaphthalimide trifluoromethanesulfonic acid ester.

4. The electroconductive film production method of claim 1, wherein the acid generator comprises p-toluenesulfonic acid-1,8-naphthalimide.

5. The method of claim 1, wherein the method is carried out in a dry state.

* * * * *